(12) United States Patent
Jo et al.

(10) Patent No.: US 9,166,205 B2
(45) Date of Patent: Oct. 20, 2015

(54) LIGHT-SCATTERING SUBSTRATE, METHOD OF MANUFACTURING THE SAME, ORGANIC LIGHT-EMITTING DISPLAY DEVICE INCLUDING THE SAME, AND METHOD OF MANUFACTURING THE ORGANIC LIGHT-EMITTING DISPLAY DEVICE

(71) Applicant: Samsung Display Co., Ltd., Yongin, Gyeonggi-do (KR)

(72) Inventors: Soo-Beom Jo, Yongin (KR); Dae-Woo Lee, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/535,806

(22) Filed: Nov. 7, 2014

(65) Prior Publication Data

US 2015/0064826 A1    Mar. 5, 2015

Related U.S. Application Data

(62) Division of application No. 13/181,611, filed on Jul. 13, 2011, now Pat. No. 8,916,892.

(30) Foreign Application Priority Data

Dec. 6, 2010    (KR) ........................ 10-2010-0123603

(51) Int. Cl.
*H01L 27/32*    (2006.01)
*H01L 33/58*    (2010.01)
(Continued)

(52) U.S. Cl.
CPC   *H01L 51/56* (2013.01); *B05D 1/38* (2013.01); *B05D 3/0254* (2013.01); *B05D 5/063* (2013.01);
(Continued)

(58) Field of Classification Search
CPC   B82Y 20/00; H01L 51/5268; H01L 51/5369; G02B 5/008; G02B 6/1226; G02F 2203/10
USPC ........ 257/49–75, 79–103, E33.067, E33.074; 313/498–512; 438/22–47, 149–166
See application file for complete search history.

(56) References Cited

U.S. PATENT DOCUMENTS

| | | | |
|---|---|---|---|
| 6,787,796 B2 | 9/2004 | Do et al. | |
| 6,806,504 B2 | 10/2004 | Park | |
| 6,998,775 B2 * | 2/2006 | Sugiura et al. | ................ 313/512 |
| 7,351,588 B2 | 4/2008 | Poponin | |

(Continued)

FOREIGN PATENT DOCUMENTS

| | | |
|---|---|---|
| CN | 1967901 A | 5/2007 |
| CN | 100474609 C | 4/2009 |

(Continued)

OTHER PUBLICATIONS

Chinese Office Action issued by Chinese Patent Office on May 6, 2015 in corresponding Chinese Patent Application No. 201110289594.9.

*Primary Examiner* — Matthew Landau
*Assistant Examiner* — Eric Ward
(74) *Attorney, Agent, or Firm* — Robert E. Bushnell, Esq.

(57) ABSTRACT

A light-scattering substrate which can be thinned and has improved thermal resistance, a method of manufacturing the same, an organic light-emitting display device including the same, and a method of manufacturing the organic light-emitting display device are disclosed. The light-scattering substrate includes a light-scattering layer composed of a plurality of metal nanoparticles which are attached to at least a surface of a substrate. The metal nanoparticles are formed by agglomeration of a metal on the substrate, and show a surface plasmon phenomenon.

11 Claims, 10 Drawing Sheets

(51) Int. Cl.

| | | |
|---|---|---|
| *H01L 51/52* | (2006.01) | |
| *H01L 51/56* | (2006.01) | |
| *G02B 5/00* | (2006.01) | |
| *H01L 27/12* | (2006.01) | |
| *H01L 29/786* | (2006.01) | |
| *B05D 1/38* | (2006.01) | |
| *B05D 3/02* | (2006.01) | |
| *B05D 5/06* | (2006.01) | |
| *H01L 51/00* | (2006.01) | |

(52) U.S. Cl.
CPC ............ *G02B 5/008* (2013.01); *H01L 27/1218* (2013.01); *H01L 27/1259* (2013.01); *H01L 27/1262* (2013.01); *H01L 27/3246* (2013.01); *H01L 29/78603* (2013.01); *H01L 29/78633* (2013.01); *H01L 51/0096* (2013.01); *H01L 51/5268* (2013.01); *H01L 27/3244* (2013.01); *H01L 51/5206* (2013.01); *H01L 51/5234* (2013.01); *H01L 2227/323* (2013.01); *H01L 2251/5369* (2013.01)

(56) References Cited

U.S. PATENT DOCUMENTS

| | | | |
|---|---|---|---|
| 7,531,955 | B2 | 5/2009 | Cok et al. |
| 7,851,995 | B2 | 12/2010 | Tyan et al. |
| 7,994,706 | B2 | 8/2011 | Choi et al. |
| 8,045,107 | B2 | 10/2011 | Tang et al. |
| 2003/0164496 | A1 | 9/2003 | Do et al. |
| 2007/0114523 | A1* | 5/2007 | Oumi et al. .................... 257/40 |
| 2007/0257608 | A1 | 11/2007 | Tyan et al. |
| 2008/0284326 | A1 | 11/2008 | Choi et al. |
| 2010/0150513 | A1 | 6/2010 | Zhang et al. |
| 2010/0311103 | A1 | 12/2010 | Boukherroub et al. |
| 2011/0008602 | A1 | 1/2011 | Peeters |
| 2011/0013192 | A1* | 1/2011 | Yang et al. ................... 356/445 |
| 2011/0187264 | A1* | 8/2011 | Yasuda et al. ................. 313/504 |
| 2011/0290551 | A1 | 12/2011 | Lee |

FOREIGN PATENT DOCUMENTS

| | | |
|---|---|---|
| CN | 101429644 A | 5/2009 |
| KR | 10-2003-0057316 | 7/2003 |
| KR | 10-2004-0004606 | 1/2004 |
| KR | 10-2007-0005822 | 1/2007 |
| WO | 2009074660 A1 | 6/2009 |

\* cited by examiner

LIGHT-SCATTERING SUBSTRATE, METHOD OF MANUFACTURING THE SAME, ORGANIC LIGHT-EMITTING DISPLAY DEVICE INCLUDING THE SAME, AND METHOD OF MANUFACTURING THE ORGANIC LIGHT-EMITTING DISPLAY DEVICE

CROSS-REFERENCE TO RELATED APPLICATIONS AND CLAIM OF PRIORITY

This application makes reference to, incorporates the same herein, and claims all benefits accruing under 35 U.S.C. §119 from an application earlier filed in the Korean Intellectual Property Office on Dec. 6, 2010 and there duly assigned Serial No. 10-2010-0123603. Furthermore, this application is filed pursuant to U.S.C. §121 as a Divisional application of Applicant's patent application Ser. No. 13/181,611 filed in the U.S. Patent & Trademark Office on 13 Jul. 2011, and assigned to the assignee of the present invention. All benefits accruing under 35 U.S.C. §120 from the aforesaid present application Ser. No. 13/181,611 are also claimed.

BACKGROUND OF THE INVENTION

1. Field of the Invention

The present invention relates to a light-scattering substrate, a method of manufacturing the same, an organic light-emitting display device including the same, and a method of manufacturing the organic light-emitting display device. More particularly, the present invention relates to a light-scattering substrate which can be thinned and which has improved thermal resistance, a method of manufacturing the same, an organic light-emitting display device including the same, and a method of manufacturing the organic light-emitting display device.

2. Description of the Related Art

The recent trend toward larger displays is increasing interest in a uniformly bright screen, and a key factor in achieving a uniformly bright screen is scattering. Many display devices use a light-scattering sheet or film to effectively utilize a light source.

A light-scattering film causes light incident in a certain direction to spread in various directions. A light-scattering film typically includes a polymer film and light-scattering particles inserted into the polymer film. To achieve light-scattering characteristics, attempts are being continuously made to control the refractive index, the size, and the shape of the light-scattering particles. However, due to the light-scattering particles, the light-scattering film should be formed to a thickness of approximately 5 to 10 µm so as to achieve a desired level of light-scattering characteristics. Thus, it is difficult to thin the light-scattering film. In addition, if the light-scattering film is made of a conventional plastic film having low thermal resistance, its characteristics may deteriorate when the plastic light-scattering film is exposed to a subsequent process for forming thin-film transistors (TFTs) during the manufacturing of a display device.

SUMMARY OF THE INVENTION

The present invention provides a light-scattering substrate which can be thinned and which has improved thermal resistance.

The present invention also provides a method of manufacturing the light-scattering substrate.

The present invention further provides an organic light-emitting display device including the light-scattering substrate.

Finally, the present invention provides a method of manufacturing the organic light-emitting display device.

However, aspects of the present invention are not restricted to the ones set forth herein. The above and other aspects of the present invention will become more apparent to one of ordinary skill in the art to which the present invention pertains by referencing the detailed description of the present invention given below.

According to an aspect of the present invention, a light-scattering substrate comprises a light-scattering layer composed of a plurality of metal nanoparticles which are attached to at least a surface of a substrate, wherein the metal nanoparticles are formed by agglomeration of a metal on the substrate and show a surface plasmon phenomenon.

According to another aspect of the present invention, a method of manufacturing a light-scattering substrate includes: forming a metal thin film on a substrate; and forming a light-scattering layer composed of metal nanoparticles by annealing the metal thin film to agglomerate a metal of the metal thin film into the metal nanoparticles.

According to another aspect of the present invention, an organic light-emitting display device comprises: a first light-scattering layer composed of metal nanoparticles which are attached to a surface of a transparent substrate; a buffer layer formed on the substrate to contain the metal nanoparticles; an active layer formed on the buffer layer and including a channel region and source and drain regions; a gate insulating film formed on the substrate and the active layer; a gate electrode formed on the gate insulating film so as to overlap the channel region; an interlayer insulating film formed on the gate insulating film so as to cover the gate electrode and including contact holes which expose predetermined regions of the source and drain regions, respectively; source and drain electrodes formed on the interlayer insulating film and connected to the source and drain regions, respectively, by the contact holes; a passivation layer formed on the interlayer insulating film so as to cover the source and drain electrodes; a first electrode formed on the passivation layer and connected to any one of the source and drain electrodes; and a pixel defined layer formed on the passivation layer and exposing a predetermined region of the first electrode.

According to another aspect of the present invention, an organic light-emitting display device comprises: an active layer formed on a substrate and including a channel region and source and drain regions; a gate insulating film formed on the substrate and the active layer; a gate electrode formed on the gate insulating film so as to overlap the channel region; an interlayer insulating film formed on the gate insulating film so as to cover the gate electrode and including first contact holes which expose the source and drain regions, respectively; source and drain electrodes formed on the interlayer insulating film and connected to the source and drain regions, respectively, by the first contact holes; a passivation layer formed on the interlayer insulating film and including a second contact hole which exposes any one of the source and drain electrodes; a first electrode formed on the passivation layer and connected to any one of the source and drain electrodes by the second contact hole; a pixel defined layer formed on the interlayer insulating film and exposing a predetermined region of the first electrode; an organic light-emitting layer formed on the predetermined region of the first electrode which is exposed by the pixel defined layer; a transparent second electrode formed on the pixel defined layer and the organic light-emitting layer; and a light-scattering layer composed of a plurality of metal nanoparticles which are attached to a top surface of the second electrode.

According to another aspect of the present invention, a method of manufacturing an organic light-emitting display device comprises: forming a plurality of metal particles attached to a transparent substrate by stacking a metal thin film on the substrate and annealing the metal thin film to agglomerate a metal of the metal thin film; and forming a buffer layer on the substrate to contain the metal particles.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
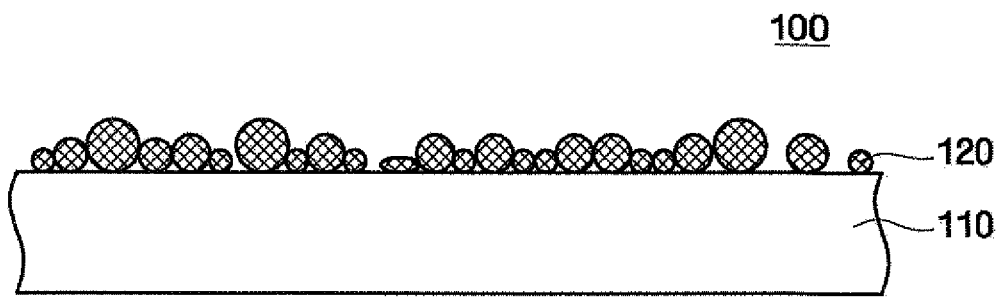
FIG. 1 is a cross-sectional view of a light-scattering substrate according to an exemplary embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to planar and cross-section illustrations which are schematic illustrations of idealized embodiments of the invention. As such, variations from the shapes of the illustrations as a result, for example, of manufacturing techniques and/or tolerance are to be expected. Thus, embodiments of the invention should not be construed as limited to the particular shapes of regions illustrated herein but are to include deviations in shapes which result, for example, from manufacturing. Thus, the regions illustrated in the figures are schematic in nature and their shapes are not intended to illustrate the actual shape of a region of a device, and are not intended to limit the scope of the invention.

Hereinafter, exemplary embodiments of the present invention will be described in further detail with reference to the accompanying drawings.

A light-scattering substrate according to an exemplary embodiment of the present invention will now be described with reference to FIG. 1.

FIG. 1 is a cross-sectional view of a light-scattering substrate according to an exemplary embodiment of the present invention.

Referring to FIG. 1, the light-scattering substrate 100 according to the exemplary embodiment of the present invention includes a light-scattering layer 120 formed on a substrate 110.

The substrate 110 may be a silicon substrate, a silicon-on-insulator (SOI) substrate, a gallium arsenic substrate, a silicon germanium (SiGe) substrate, a ceramic substrate, a quartz substrate, or a glass substrate for displays. Any substrate for displays can be used as the substrate 110. In addition, the substrate 110 may be formed of a material or a mixture of materials selected from the group consisting of cellulose derivatives such as cellulose triacetate (TAC), polyethylene terephthalate (PET), polybutylene terephthalate (PBT), polyester resin such as polyester acrylate, polysulfone resin such as polyethersulfone (PES), polyetherketone resin such as polyetherketone (PEK), polyetheretherketone (PEEK), polycarbonate resin, polyolefin acrylic resin, styrene resin, and a copolymer of these materials.

The substrate 110 may be formed to a thickness of 10 to 100 nm. The substrate 110 formed to a thickness in the above range contributes to the thinning of the light-scattering substrate 100 and provides appropriate strength to the light-scattering substrate 100.

The light-scattering layer 120 is formed on the substrate 110 and is composed of a plurality of metal nanoparticles.

The metal nanoparticles are attached to an upper surface of the substrate 110. Here, the metal nanoparticles may not necessarily cover the entire surface of the substrate 110, exposing part of the substrate 110. The light-scattering layer 120 according to the current exemplary embodiment is not in the form of a sheet or film into which light-scattering particles have been inserted. Instead, a plurality of metal nanoparticles attached onto the substrate 110 form the light-scattering layer 120. Therefore, no film or sheet for accommodating the metal nanoparticles is required, thus contributing to the thinning of the light-scattering substrate 100.

The metal nanoparticles can have any shape such as a circular, oval or amorphous shape. Also, they may overlap each other in multiple layers.

The metal nanoparticles may have a diameter of 50 to 500 nm. Sine the metal nanoparticles are not uniform in diameter, the diameter denotes an average diameter. When the diameter of the metal nanoparticles is in the above range, the thinning of the light-scattering substrate 100 can be achieved. Furthermore, light-scattering efficiency can be improved, which, in turn, makes a display screen have uniform brightness and high luminance.

The metal nanoparticles may be formed using metal which shows a surface plasmon phenomenon. Metals showing the surface plasmon phenomenon easily emit electrons in response to an external stimulus and have a negative dielectric constant. Specifically, the metal nanoparticles may be made of a metal or a mixture of metals selected from the group consisting of Cu, Ni, Co, Fe, Zn, Ti, Cr, Ag, Au, Pt, Al, Pd, and an alloy of these metals. If possible, the metal nanoparticles may be made of Ag or Au, which exhibits superior light-scattering properties and surface stability, or an alloy of Ag or Au and one or more of Cu and Pd.

Surface plasmons refer to quasiparticles which describe the collective oscillation of free electrons at the surface of a metal. In the current exemplary embodiment, light arriving at the surface of the metal nanoparticles which shows the surface plasmon phenomenon causes the metal nanoparticles to oscillate. In so doing, the light is scattered.

The metal nanoparticles are formed by agglomeration of a metal coated on the substrate 110. The agglomeration of the metal may result in partial exposure of the substrate 110.

The agglomeration of the metal may be caused by an annealing process. Therefore, the metal nanoparticles may be made of a metal which can agglomerate on the substrate 110 during the annealing process due to its high surface energy, among metals showing the surface plasmon phenomenon. Specifically, the metal nanoparticles may be made of Ag, Au, a mixture of Ag and Au, or an alloy of Ag or Au and one or more of Cu, Ni, Co, Fe, Zn, Ti, Cr, Pt, Al and Pd. Here, the Ag or Au may be added at 80 wt % or more based on a total weight of the alloy. When added at 80 wt % or more, the Ag or Au can agglomerate into metal nanoparticles and exhibit a superior light-scattering effect.

The light-scattering layer 120 according to the current exemplary embodiment is advantageous to the thinning of the light-scattering substrate 100 since it is formed not by the insertion of metal nanoparticles into a sheet or film, but by the agglomeration of metal particles on the substrate 110. Since no film or sheet is used, the thermal resistance of the light-scattering layer 120 can be improved. In particular, when the substrate 110 is made of glass, silicon or quartz instead of plastic, the thermal resistance of the light-scattering substrate 100 can be further improved.

Hereinafter, a light-scattering substrate according to another exemplary embodiment of the present invention will be described with reference to FIG. 2.

Figure 2:
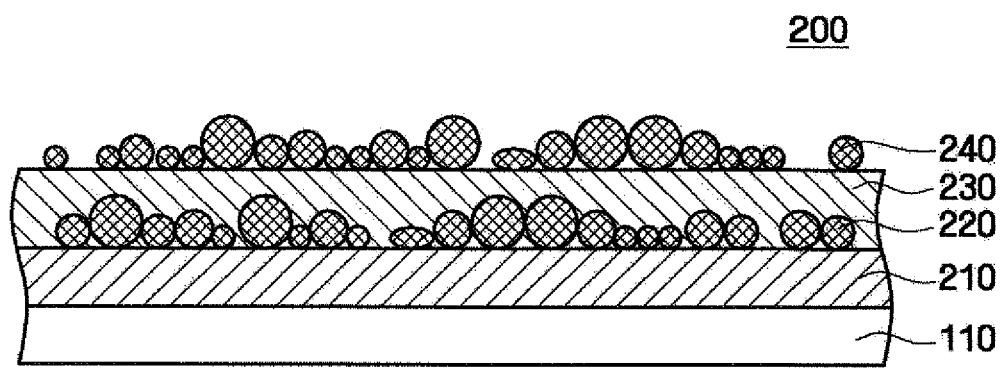
FIG. 2 is a cross-sectional view of a light-scattering substrate according to another exemplary embodiment of the present invention.

FIG. 2 is a cross-sectional view of a light-scattering substrate 200 according to another exemplary embodiment of the present invention.

Referring to FIG. 2, the light-scattering substrate 200 according to the current exemplary embodiment has the same configuration as the light-scattering substrate 100 of FIG. 1, except that it includes multiple light-scattering layers and transparent conductive layers. The following description will focus on these differences, and elements substantially identical to those of the previous embodiment are indicated by like reference numerals, and thus a detailed description thereof will be omitted.

Referring to FIG. 2, the light-scattering substrate 200 according to the current exemplary embodiment includes a substrate 110, a first transparent conductive layer 230, a second transparent conductive layer 210, a first light-scattering layer 220, and a second light-scattering layer 240.

The first transparent conductive layer 230 may be formed on the second transparent conductive layer 210 and the first light-scattering layer 220, and the first light-scattering layer 220 may be contained in the first transparent conductive layer 230. The first transparent conductive layer 230 maximizes the light-scattering effect of metal nanoparticles of the first light-scattering layer 220, and prevents the metal nanoparticles from agglomerating again when a subsequent process is performed at a high temperature.

The first transparent conductive layer 230 may be made of any transparent material which gives conductivity. If possible, the first transparent conductive layer 230 may be made of a material superior in transparency, conductivity and thermal resistance, such as indium tin oxide (ITO), indium zinc oxide (IZO), ZnO or $In_2O_3$.

The first transparent conductive layer 230 may be formed to a thickness of 1 to 50 nm. When formed to a thickness in the above range, the first transparent conductive layer 230 can further improve the light-scattering effect and add heat-resisting properties to a light-scattering sheet.

The second transparent conductive layer 210 may be formed between the substrate 110 and the first light-scattering layer 220. The second transparent conductive layer 210 maximizes the light-scattering effect of the metal nanoparticles, gives heat-resisting properties to the light-scattering substrate 200, and increases the adhesion of the first light-scattering layer 220 to the substrate 110.

The second transparent conductive layer 210 may be made of any transparent material which gives conductivity. If possible, the second transparent conductive layer 210 may be made of a material superior in transparency, conductivity, and thermal resistance, such as ITO, IZO, ZnO or $In_2O_3$. The second transparent conductive layer 210 can be omitted as desired by those of ordinary skill in the art.

The light-scattering substrate 200 shown in FIG. 2 includes two transparent conductive layers and two light-scattering layers. However, the present invention is not limited thereto. For example, the first transparent conductive layer 230 may be formed on the first light-scattering layer 220 so as to contain the first light-scattering layer 220, and the second light-scattering layer 240 may be formed on the first transparent conductive layer 230. By repeating this process, a light-scattering substrate having a plurality of light-scattering layers may be formed. The plurality of light-scattering layers further improves the light-scattering effect of the light-scattering substrate.

As described above, there is no need to insert a film or sheet into a light-scattering substrate according to the present invention, and this absence of a film or sheet makes the thinning of the light-scattering substrate possible. Furthermore, the light-scattering substrate offers better thermal resistance than conventional films or sheets.

Hereinafter, a method of manufacturing a light-scattering substrate according to an exemplary embodiment of the present invention will be described with reference to FIGS. 3 and 4 thru 6.

Figure 3:
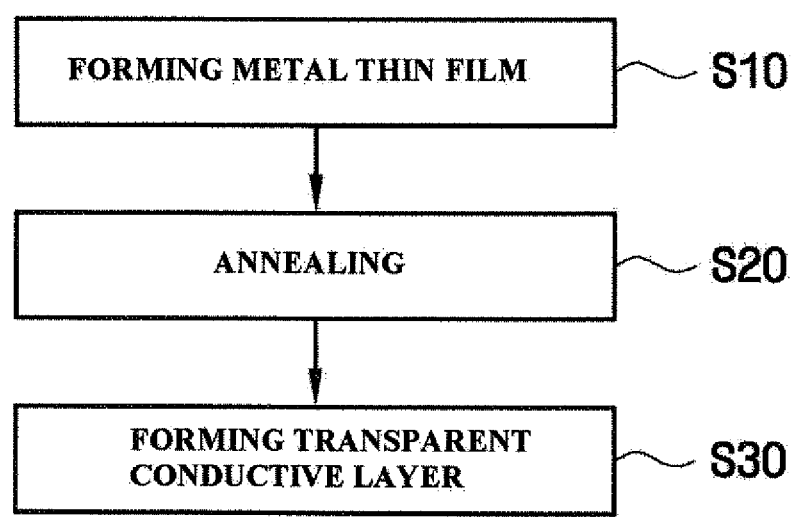
FIG. 3 is a flowchart illustrating a method of manufacturing a light-scattering substrate according to an exemplary embodiment of the present invention.
Figure 4:
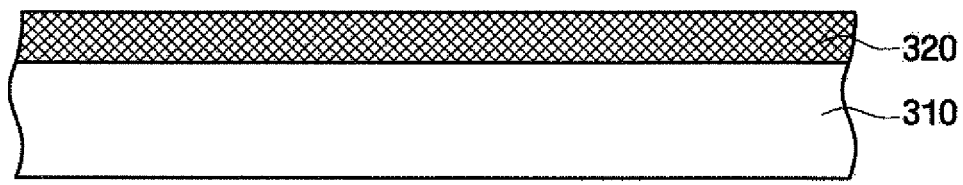
FIGS. 4 thru 6 are cross-sectional views respectively illustrating processes in the method of manufacturing a light-scattering substrate according to the exemplary embodiment of the present invention.
Figure 5:
Figure 6:
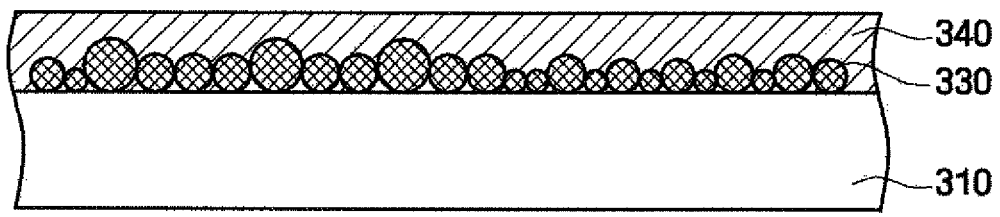

FIG. 3 is a flowchart illustrating a method of manufacturing a light-scattering substrate according to an exemplary embodiment of the present invention; and FIGS. 4 thru 6 are cross-sectional views respectively illustrating processes in the method of manufacturing a light-scattering substrate according to the exemplary embodiment of the present invention.

Referring to FIG. 3, the method of manufacturing a light-scattering substrate according to the current exemplary embodiment includes forming a metal thin film (operation S10), performing an annealing process (operation S20), and forming a transparent conductive layer (operation S30).

Referring to FIG. 4, a metal thin film 320 is formed on a substrate 310 in the forming of the metal thin film (operation S10).

Specifically, the metal thin film 320 is deposited on at least a surface of the substrate 310 by sputtering, chemical vapor deposition (CVD), or the like.

The substrate 310 may be a silicon substrate, an SOI substrate, a gallium arsenic substrate, an SiGe substrate, a ceramic substrate, a quartz substrate, or a glass substrate for displays. Any substrate for displays can be used as the substrate 310. The substrate 310 may also be made of resin. If possible, resin having superior thermal resistance, such as TAC, may be used.

The metal thin film 320 may be formed on at least a surface of the substrate 310. The metal thin film 320 may also be formed on both surfaces of the substrate 310.

The metal thin film 320 may be made of Ag, Au, a mixture of Ag and Au, or an alloy of Ag or Au and one or more of Cu, Ni, Co, Fe, Zn, Ti, Cr, Pt, Al and Pd. Since Ag or Au has a high surface energy, it may agglomerate together during annealing and may show the surface plasmon phenomenon. Specifically, the metal thin film 320 may be made of an alloy of Ag, Pd, and Cu. Here, the Ag may be added at 80 wt % or more based on a total weight of the alloy.

The metal thin film 320 may be formed to a thickness of 100 to 200 Å. When formed to a thickness in the above range, metal particles of the metal thin film 320 may agglomerate into metal nanoparticles in the performance of the annealing process (operation S20), thereby contributing to the thinning of a light-scattering substrate.

Referring to FIG. 5, the metal thin film 320 is annealed in the performance of the annealing process (operation S20). As a result, a light-scattering layer 330 composed of metal nanoparticles is formed.

Specifically, the metal thin film 320 is annealed to agglomerate the metal particles therein into a plurality of metal nanoparticles attached onto the substrate 310.

When the metal thin film 320 is heated, Ag or Au having a high surface energy agglomerates with its ambient particles to form metal nanoparticles. The metal nanoparticles have various sizes and shapes. When light reaches the metal nanoparticles attached onto the substrate 310, the metal nanoparticles scatter the light due to the surface plasmon phenomenon.

As the thickness of the metal thin film 320 increases, the diameter of the metal nanoparticles tends to increase. In addition, under the same conditions, the metal thin film 320 tends to be formed into metal nanoparticles having a greater diameter when made of pure metal than when made of an alloy. Specifically, when metal nanoparticles are formed by depositing and annealing pure Ag, the area of a region of a substrate, which is exposed by the agglomeration of Ag, is relatively large. However, when metal nanoparticles are formed by depositing and annealing an alloy of Ag, Pd and Cu, Pd or Cu acts to hinder the agglomeration of Ag, thereby reducing the area of a region of the substrate which is exposed. An increase in the diameter of the metal nanoparticles results in higher haze. However, those of ordinary skill in the art can adjust the diameter of the metal nanoparticles by selecting a metal material in view of a desired haze level. Specifically, the metal nanoparticles may be formed to an average diameter of 50 to 500 nm. The metal nanoparticles have high haze values in the above diameter range.

The annealing process may be performed using a thermal annealing method using a furnace, a laser annealing method, or a rapid thermal annealing (RTA) method. In addition, the annealing process may be performed at a temperature of 200 to 350° C. for one hour in the atmosphere of an inert gas such as air or nitrogen. The conditions under which the annealing process is performed can be arbitrarily changed by those of ordinary skill in the art. If possible, however, the annealing process may be performed at a temperature of 200 to 350° C. In the above temperature range, metal particles can agglomerate actively without affecting other properties of the substrate 310. As described above, the light-scattering layer 330 according to the current exemplary embodiment is composed of metal nanoparticles formed by annealing the metal thin film 320 on the substrate 310, instead of inserting metal nanoparticles into a film or sheet. The light-scattering layer 330 thus formed can contribute to the thinning of the light-scattering substrate and improve the thermal resistance of the light-scattering substrate.

Referring to FIG. 6, in the formation of the transparent conductive layer (operation S30), a transparent conductive material is deposited on the substrate 310 so as to form a transparent conductive layer 340 containing the metal nanoparticles.

Specifically, a transparent material having superior conductivity, such as ITO or IZO, is deposited on the substrate 310 and the light-scattering layer 330 by, e.g., CVD, thereby forming the transparent conductive layer 340.

The transparent conductive layer 340 further increases the light-scattering effect of the metal nanoparticles and protects the metal nanoparticles when the metal manoparticles are exposed to high heat in a subsequent process.

The forming of the metal thin film (operation S10), the performing of the annealing process (operation S20), and the forming of the transparent conductive layer (operation S30) may be repeatedly performed to form a light-scattering substrate having multiple transparent conductive layers and multiple light-scattering layers. In addition, a transparent conductive layer may be formed on a substrate before the forming of the metal thin film (operation S10), and a metal thin film may be formed on the transparent conductive layer.

Hereinafter, an organic light-emitting display device according to an exemplary embodiment of the present invention will be described with reference to FIG. 7.

Figure 7:
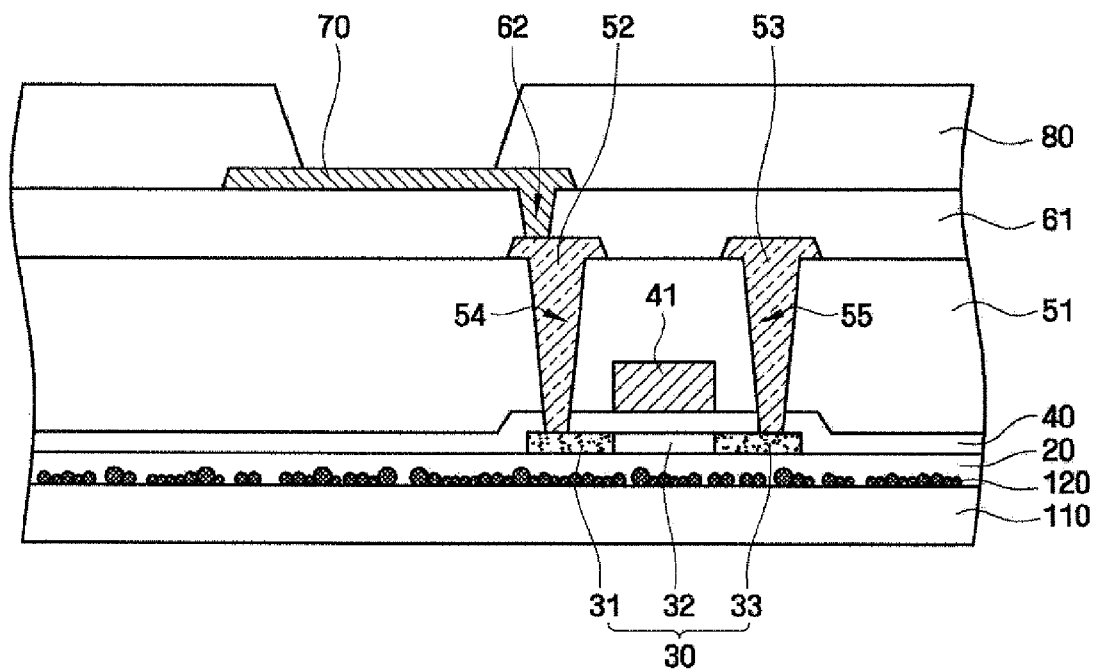
FIG. 7 is a cross-sectional view of an organic light-emitting display device according to an exemplary embodiment of the present invention.

FIG. 7 is a cross-sectional view of an organic light-emitting display device according to an exemplary embodiment of the present invention.

Referring to FIG. 7, the organic light-emitting display device according to the current exemplary embodiment includes a substrate 110, a light-scattering layer 120, a buffer layer 20, an active layer 30, a gate insulating film 40, a gate electrode 41, an interlayer insulating film 51, source and drain electrodes 52 and 53, respectively, a passivation layer 61, a first electrode 70, and a pixel defined layer 80.

The substrate 110 may be appropriately selected by those of ordinary skill in the art from a transparent substrate, a quartz substrate, a ceramic substrate, a silicon substrate, and a flexible substrate made of, e.g., plastic. If possible, the substrate 110 may be made of a transparent glass material containing $SiO_2$ as its main component. The plastic may be an organic material selected from the group consisting of polyethyelenennapthalate, polyimide, polyallylate, polyphenylenesulfide, polyethersulphone, polyacrylate, polycarbonate, polyethyeleneterepthalate, polysulphone, polyetherimide, cellulosetriacetate, and celluloseacetatepropionate.

The light-scattering layer 120 is composed of metal nanoparticles formed by depositing a metal thin film on the entire surface of the substrate 110 using a method such as sputtering or CVD and annealing the metal thin film. Since the organic light-emitting display device according to the current exemplary embodiment includes the light-scattering layer 120 composed of metal nanoparticles formed directly on the substrate 110, there is no need to insert a light-scattering sheet or film into the organic light-emitting display device.

The light-scattering layer 120, composed of a plurality of metal nanoparticles which exhibit the surface plasmon phenomenon, scatters light generated by an organic light-emitting layer (not shown) of the organic light-emitting display device. The metal nanoparticles come in various diameters, and can have any shape such as a circular or oval. In addition, the metal nanoparticles may overlap each other in multiple layers. As the metal nanoparticles are formed, the substrate 110 may be partially exposed. The metal nanoparticles may be formed to an average diameter of 50 to 500 nm.

The buffer layer 20 forms a smooth surface on the substrate 110 and keeps impurities from infiltrating into the substrate 110. The buffer layer 20 may be made of any material which enables the buffer layer 20 to perform the above function. If possible, the buffer layer 20 may be made of $SiO_2$ and/or $SiN_x$.

The buffer layer 20 is formed on the entire surface of the substrate 110 so as to completely cover the light-scattering layer 120. That is, the metal nanoparticles of the light-scattering layer 120 are contained in the buffer layer 20.

The active layer 30 is formed on the buffer layer 20 and may be made of an inorganic semiconductor, such as amorphous silicon or polycrystalline silicon, or an organic semiconductor. The active layer 30 includes a channel region 32 unimplanted with impurity ions and source and drain regions 31 and 33, respectively, disposed on both sides of the channel region 32 and implanted with p- or n-type impurity ions. The impurity ions may vary according to the type of transistor. For example, donor impurity ions, such as P, As or Sb, may be injected to manufacture an N-type thin-film transistor (TFT). On the other hand, acceptor impurity ions, such as B, Al, Ga or In, may be injected so as to manufacture a P-type TFT.

The gate insulating film 40 is formed on the entire surface of the substrate 110, the buffer layer 20, and the active layer 30. The gate insulating film 40 may be formed using a conventional method known in the art, such as CVD or plasma-enhanced chemical vapor deposition (PECVD). The gate insulating film 40 may be made of an inorganic material, an organic material, or a mixture of the inorganic material and the organic material. Examples of the inorganic material may include $SiO_2$, $SiN_x$, and SiON.

The gate electrode 41 is formed on the gate insulating film 40 and overlaps the channel region 32 of the active layer 30. The gate electrode 41 may be formed of a single layer of a material or a mixture of materials selected from the group consisting of Mo, W, AlNd, Ti, Al, Ag, and an alloy of these materials. Alternatively, the gate electrode 41 may be formed of a double- or multi-layer of Mo, Al or Ag, which is a material with low resistivity, in order to reduce wiring resistance. That is, to reduce wiring resistance, multiple conductive layers may be sequentially stacked. Specifically, the gate electrode 41 may have a multi-layer structure composed of Mo/Al/Mo, MoW/AlNd/MoW, Mo/Ag/Mo, Mo/Ag alloy/Mo, or Ti/Al/Mo.

The interlayer insulating film 51 is formed on the gate insulating film 40 so as to cover the gate electrode 41. An upper surface of the interlayer insulating film 51 may be planar. Contact holes 54 and 55 exposing the source and drain regions 31 and 33, respectively, of the active layer 30 are formed in the interlayer insulating film 51.

The interlayer insulating film 51 may be formed of an inorganic insulating film or an organic insulating film. Examples of the inorganic insulating film which forms the interlayer insulating film 51 include $SiO_2$, $SiN_x$, SiON, $Al_2O_3$, $TiO_2$, $Ta_2O_5$, $HfO_2$, $ZrO_2$, BST and PZT, and examples of the organic insulating film include general-purpose polymer (such as polymethylmethacrylate (PMMA) or polystyrene (PS)), polymer derivatives having a phenol group, acrylic polymer, imide polymer, aryl ether polymer, amide polymer, fluoride polymer, p-xylene polymer, vinyl alcohol polymer, and a blend of these materials. Also, the interlayer insulating film 51 may be formed of a stack of an inorganic insulating film and an organic insulating film.

The source and drain electrodes 52 and 53, respectively, are formed on the interlayer insulating film 51 and are connected to the source and drain electrodes 31 and 33, respectively, of the active layer 30 by the contact holes 54 and 55, respectively.

Each of the source and drain electrodes 52 and 53, respectively, may be formed of a single layer of a material or a mixture of materials selected from the group consisting of Mo, W, MoW, AlNd, Ti, Al, Al alloy, Ag, and Ag alloy. Alternatively, each of the source and drain electrodes 52 and 53, respectively, may be formed of a double- or multi-layer of Mo, Al or Ag, which is a material with low resistivity, in order to reduce wiring resistance. That is, each of the source and drain electrodes 52 and 53, respectively, may have a multi-layer structure composed of Mo/Al/Mo, MoW/AlNd/MoW, Ti/Al/Ti, Mo/Ag/Mo, or Mo/Ag alloy/Mo.

The passivation layer 61 is formed on the interlayer insulating film 51 and the source and drain electrodes 52 and 53, respectively, and a contact hole 62 exposing any one of the source and drain electrodes 52 and 53, respectively, is formed in the passivation layer 61. The passivation layer 61 may be formed of an inorganic insulating layer or an organic insulating layer.

The first electrode 70 is formed on the passivation layer 61 and is connected to any one of the source and drain electrodes 52 and 53, respectively, by the contact hole 62. The first electrode 70 may be formed of a transparent conductive film containing one or more transparent materials selected from ITO, IZO, ZnO, and $In_2O_3$.

The pixel defined layer 80 is formed on the passivation layer 61 and exposes the first electrode 70. The pixel defined layer 80 may be made of a material or a mixture of materials selected from the group consisting of polyacrylic resin, epoxy rein, phenol resin, polyamide resin, polyimide resin, unsaturated polyester resin, polyphenylene resin, polyphenylene sulfide resin, and benzocyclobutene.

Hereinafter, an organic light-emitting display device according to another exemplary embodiment of the present invention will be described with reference to FIG. 8.

Figure 8:
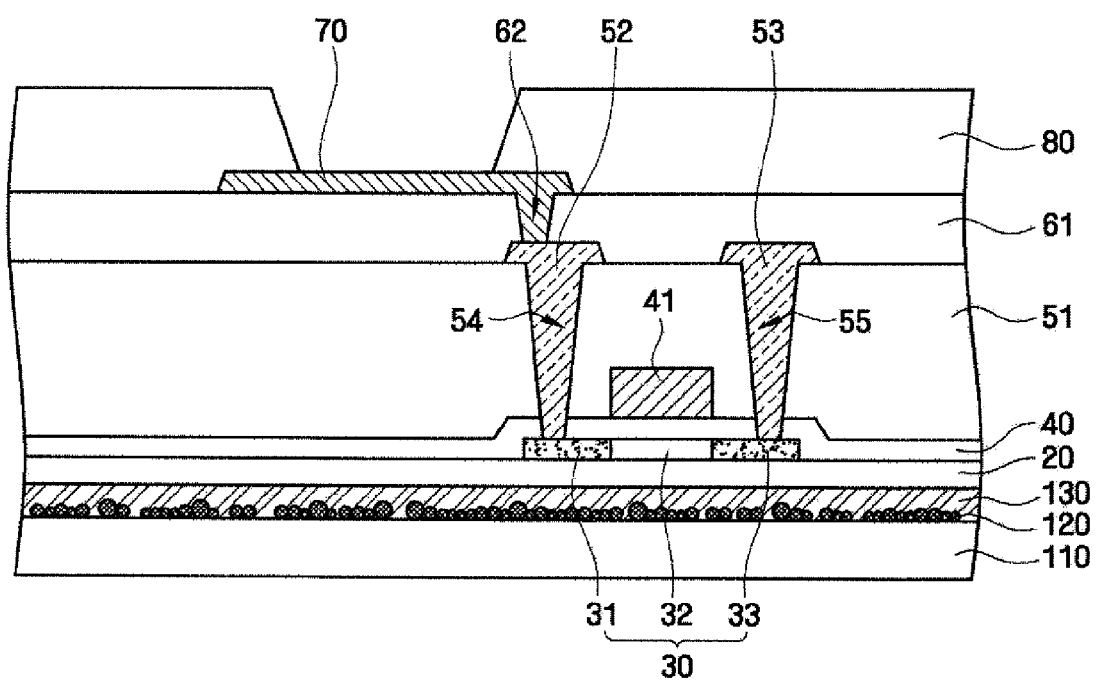
FIG. 8 is a cross-sectional view of an organic light-emitting display device according to another exemplary embodiment of the present invention.

FIG. 8 is a cross-sectional view of an organic light-emitting display device according to another exemplary embodiment of the present invention.

The organic light-emitting display device according to the current exemplary embodiment has the same configuration as the organic light-emitting display device of FIG. 7, except that it includes a transparent conductive layer 130. The following description will focus on these differences, and elements substantially identical to those of the previous embodiment are indicated by like reference numerals, and thus a detailed description thereof will be omitted.

Referring to FIG. 8, the organic light-emitting display device according to the current exemplary embodiment includes a substrate 110, a light-scattering layer 120, a transparent conductive layer 130, a buffer layer 20, an active layer 30, a gate insulating film 40, a gate electrode 41, an interlayer insulating film 51, source and drain electrodes 52 and 53, respectively, a passivation layer 61, a first electrode 70, and a pixel defined layer 80.

The transparent conductive layer 130 is formed on the substrate 110 and the light-scattering layer 120 so as to cover the light-scattering layer 120. Therefore, metal nanoparticles of the light-scattering layer 120 are contained in the transparent conductive layer 130. The transparent conductive layer 130 increases the light-scattering effect of the metal nanoparticles of the light-scattering layer 120, and prevents the metal nanoparticles from agglomerating again when exposed to high heat in a subsequent process. The transparent conductive layer 130 may be made of ITO, IZO, ZnO, or $In_2O_3$.

The transparent conductive layer 130 may be formed to a thickness of 1 to 50 nm. The transparent conductive layer 130 formed to a thickness in the above range can further increase the light-scattering effect and enhance the thermal resistance of the organic light-emitting display device.

In FIG. 8, each of the light-scattering layer 120 and the transparent conductive layer 130 is formed as a single layer. However, the present invention is not limited thereto. A second light-scattering layer (not shown) composed of metal nanoparticles may be formed by forming a metal thin film on the transparent conductive layer 130 and annealing the metal thin film, and a second transparent conductive layer (not shown) may be formed on the second light-scattering layer. This process may be repeatedly performed so as to manufacture an organic light-emitting display device having multiple light-scattering layers and multiple transparent conductive layers.

Hereinafter, an organic light-emitting display device according to another exemplary embodiment of the present invention will be described with reference to FIG. 9.

Figure 9:
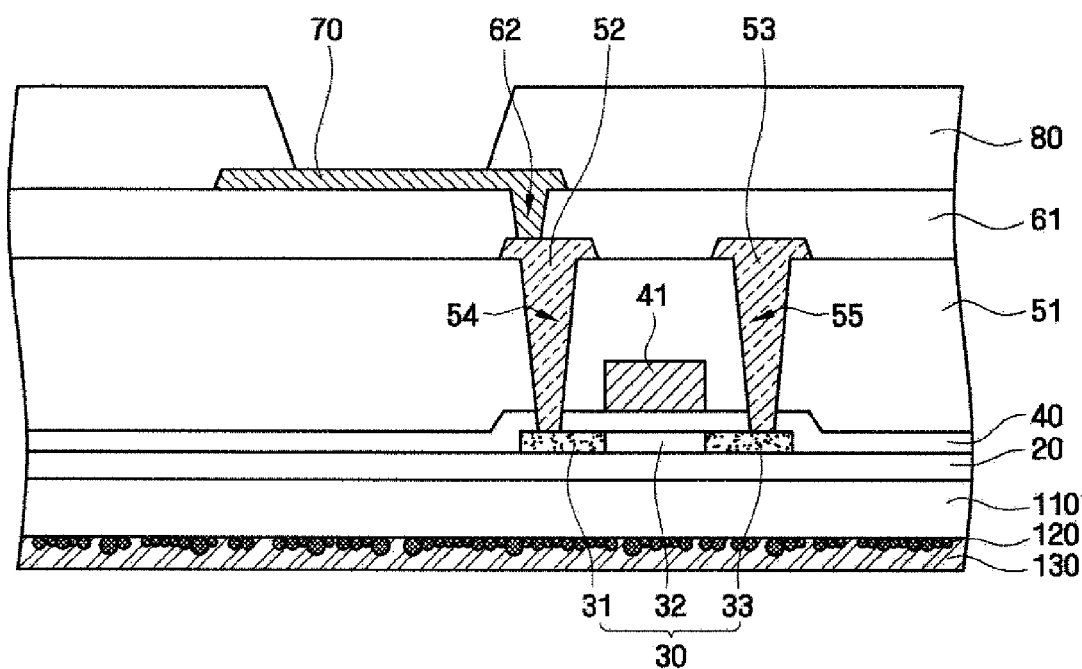
FIG. 9 is a cross-sectional view of an organic light-emitting display device according to another exemplary embodiment of the present invention.

FIG. 9 is a cross-sectional view of an organic light-emitting display device according to another exemplary embodiment of the present invention.

The organic light-emitting display device according to the current exemplary embodiment has the same configuration as the organic light-emitting display device of FIG. 8, except that a light-scattering layer 120 and a transparent conductive layer 130 are formed under a substrate 110. The following description will focus on these differences, and elements substantially identical to those of the previous embodiment are indicated by like reference numerals and thus a detailed description thereof will be omitted.

Referring to FIG. 9, the organic light-emitting display device according to the current exemplary embodiment includes the light-scattering layer 120, the transparent conductive layer 130, the substrate 110, a buffer layer 20, an active layer 30, a gate insulating film 40, a gate electrode 41, an interlayer insulating film 51, source and drain electrodes 52 and 53, respectively a passivation layer 61, a first electrode 70, and a pixel defined layer 80.

The light-scattering layer 120 is formed on a lower surface of the substrate 110 and composed of a plurality of metal nanoparticles. The light-scattering layer 120 is in the form of the metal nanoparticles attached to the lower surface of the substrate 110. Since the light-scattering layer 120 is formed directly on the substrate 110, the metal nanoparticles are attached to the substrate and all of the metal nanoparticles are connected to the substrate 110. The organic light-emitting display device according to the current exemplary embodiment has a bottom emission structure in which light is emitted in the direction of the substrate 110. The substrate 110 may be made of a transparent material. As light is emitted through the substrate 110, it is scattered by the metal nanoparticles of the light-scattering layer 120.

The transparent conductive layer 130 is formed under the substrate 110 so as to be thicker than the light-scattering layer 120. Accordingly, the metal nanoparticles of the light-scattering layer 120 are contained within the transparent conductive layer 130.

Hereinafter, an organic light-emitting display device according to another exemplary embodiment of the present invention will be described with reference to FIG. 10.

Figure 10:
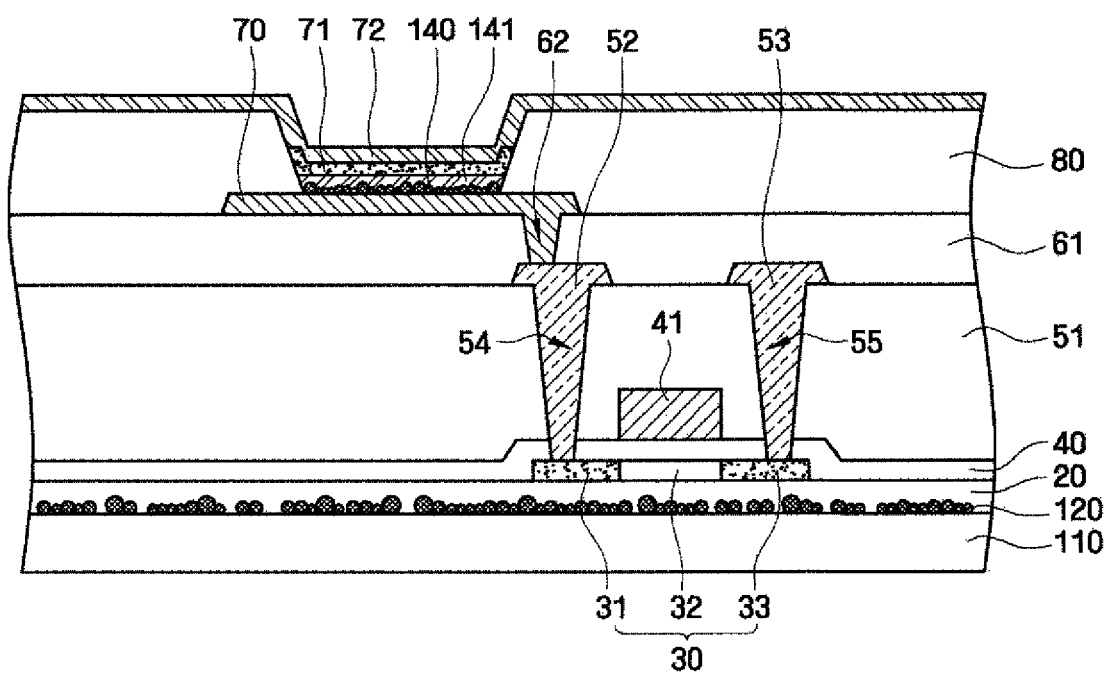
FIG. 10 is a cross-sectional view of an organic light-emitting display device according to another exemplary embodiment of the present invention.

FIG. 10 is a cross-sectional view of an organic light-emitting display device according to another exemplary embodiment of the present invention.

The organic light-emitting display device according to the current exemplary embodiment has the same configuration as the organic light-emitting display device of FIG. 7, except that a light-scattering layer 140, a transparent conductive layer 141, an organic light-emitting layer 71, and a second electrode 72 are formed on a first electrode 70. The following description will focus on these differences, and elements substantially identical to those of the previous embodiment are indicated by like reference numerals, and thus a detailed description thereof will be omitted.

The light-scattering layer 140 is formed on the first electrode 70 and is composed of a plurality of metal nanoparticles. The metal nanoparticles are attached onto the first electrode 70 so as to form the light-scattering layer 140. The organic light-emitting display device according to the current exemplary embodiment is a bottom emission type in which an image is formed in the direction of the substrate 110. Accordingly, the first electrode 70 may be made of a transparent material. Light generated by the organic light-emitting layer 71 is scattered by the light-scattering layer 140 before passing through the first electrode 70.

The light-scattering layer 140 may be formed in the same way as the light-scattering layer 120 of the organic light-emitting display device shown in FIG. 7. More specifically, the metal nanoparticles are formed by depositing a metal thin film on an exposed region of the first electrode 70 using a method such as sputtering or CVD, and annealing the metal thin film to induce the agglomeration of a metal of the metal thin film. The metal nanoparticles remain attached onto the first electrode 70 and scatter light generated by the organic light-emitting layer 71.

The transparent conductive layer 141 is formed on the first electrode 70 so as to be thicker than the light-scattering layer 140. Accordingly, the metal nanoparticles of the light-scattering layer 140 are contained in the transparent conductive layer 141. The transparent conductive layer 141 may be made of ITO, IZO, ZnO or $In_2O_3$, and the metal nanoparticles increase the light-scattering effect. The transparent conductive layer 141 may be omitted as desired by those of ordinary skill in the art. The organic light-emitting layer 71 can also be formed immediately on the light-scattering layer 140.

The organic light-emitting layer 71 is formed on the transparent conductive layer 141 and emits light in response to the electrical driving of the first electrode 70 and the second electrode 72. The organic light-emitting layer 71 may be made of a low or high molecular weight organic material. When the organic light-emitting layer 71 is made of a low molecular weight organic material, a hole transport layer and a hole injection layer are stacked in the direction of the first electrode 70 with respect to the organic light-emitting layer 71, and an electron transport layer and an electron injection layer are stacked in the direction of the second electrode 72 with respect to the organic light-emitting layer 71. Also, various layers, other than the above layers, may be stacked as desired. Examples of the organic material include, but are not limited to, copper phthalocyanine (CuPc), N,N'-Di(naphthalene-1-yl)-N,N'-diphenyl-benzidine (NPB), tris-8-hydroxyquinoline aluminum (Alq3).

When the organic light-emitting layer 71 is a high molecular weight organic layer made of a high molecular weight organic material, only a hole transport layer may be formed in the direction of the first electrode 70 with respect to the organic light-emitting layer 71. The hole transport layer is formed of poly-(2,4)-ethylene-dihydroxythiophene (PEDOT) or polyaniline (PANI) on the first electrode 70 by using an inkjet printing or spin coating method. Polyphenylene vinylene (PPV), soluble PPV's, cyano-PPV, or polyfluorene may be used for the organic light-emitting layer 71. In addition, a color pattern may be formed using a conventional method, such as inkjet printing, spin coating, or thermal transfer using a laser.

The second electrode 72 is formed on the organic light-emitting layer 71. In the organic light-emitting display device according to the current exemplary embodiment, the first electrode 70 is used as an anode electrode, and the second electrode 72 is used as a cathode electrode. However, the polarities of the first and second electrodes 70 and 71, respectively, can also be reversed. When the organic light-emitting display device is a bottom emission type in which an image is formed in the direction of the substrate 110, the first electrode 70 is a transparent electrode, and the second electrode 72 is a reflective electrode. The second electrode 72 may be made of a metal having a small work function, such as Ag, Mg, Al, Pt, Pd, Au, Ni, Nd, Ir, Cr, Li, or Ca. A sealant (not shown) may further be provided on the second electrode 72 in order to protect the organic light-emitting layer 71 from external moisture or oxygen.

Hereinafter, an organic light-emitting display device according to another exemplary embodiment of the present invention will be described with reference to FIG. 11.

Figure 11:
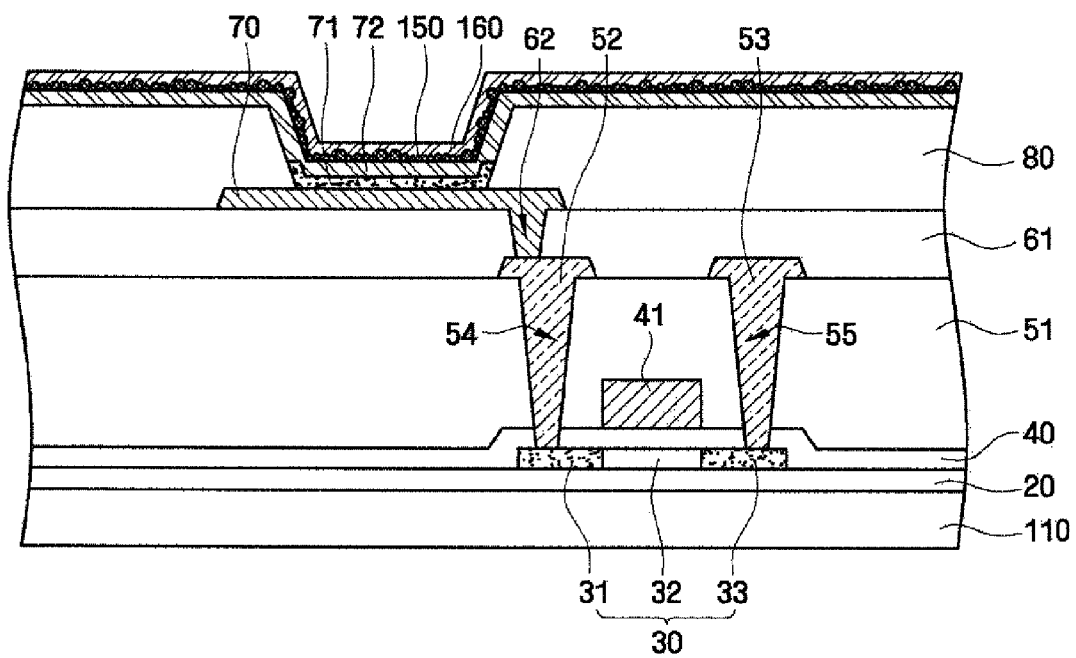
FIG. 11 is a cross-sectional view of an organic light-emitting display device according to another exemplary embodiment of the present invention.

FIG. 11 is a cross-sectional view of an organic light-emitting display device according to another exemplary embodiment of the present invention.

The organic light-emitting display device according to the current exemplary embodiment has the same configuration as the organic light-emitting display device of FIG. 7, except that no light-scattering layer is formed on a substrate 110 while a light-scattering layer 150 and a transparent conductive layer 160 are formed on a second electrode 72. The following description will focus on these differences, and elements substantially identical to those of the previous embodiment are indicated by like reference numerals, and thus a detailed description thereof will be omitted.

The light-scattering layer 150 is formed on the second electrode 72. Like the light-scattering layers 120 and 140 shown in FIG. 10, the light-scattering layer 150 is composed of a plurality of metal nanoparticles attached onto the second electrode 72. The organic light-emitting display device according to the current exemplary embodiment is a top emission type in which an image is formed in an opposite direction of the substrate 110. In the top emission organic light-emitting display device, the second electrode 72 is a transparent electrode, and the first electrode 70 is a reflective electrode. Therefore, there is no need to form a light-scattering layer on or under the substrate 110. Light generated by the organic light-emitting layer 71 passes through the second electrode 72 and is scattered by the metal nanoparticles of the light-scattering layer 150.

The transparent conductive layer 160 is formed on the second electrode 72, and may be formed of the same material as the second electrode 72. The transparent conductive layer 160 is formed on the second electrode 72 so as to be thicker than the light-scattering layer 150, and the metal nanoparticles, of the light-scattering layer 150 are contained in the transparent conductive layer 160. The transparent conductive layer 160 increases the light-scattering effect of the metal nanoparticles and may be omitted as desired by those of ordinary skill in the art.

As described above, an organic light-emitting display device according to the present invention includes a light-scattering layer formed directly on a substrate. Therefore, no light-scattering film or sheet is needed. In addition, the light-scattering layer is not in the form of an organic or inorganic layer into which light-scattering particles have been inserted. Instead, the light-scattering layer is in the form of metal nanoparticles attached directly onto the substrate. This structure is advantageous to the thinning of the organic light-emitting display device, and enables the organic light-emitting display device to exhibit superior thermal resistance.

A light-scattering substrate according to the present invention can be used not only in the above organic light-emitting display device, but also in optical devices and apparatuses such as liquid crystal displays (LCDs).

An LCD includes a TFT substrate having TFTs, a substrate facing the TFT substrate, and a liquid crystal layer interposed between the two substrates. A light-scattering substrate according to an exemplary embodiment of the present invention may be used as the TFT substrate or the substrate facing the TFT substrate in the LCD. When the light-scattering substrate, in which a light-scattering layer according to an exemplary embodiment of the present invention is formed directly on a substrate, is used as the TFT substrate or the substrate facing the TFT substrate, there is no need to install a light-scattering film. Metal nanoparticles attached onto the light-scattering substrate scatter light incident upon a panel, thereby making a display screen bright and capable of displaying a clear image.

When the substrate is made of resin, the light-scattering substrate according to the present invention may be inserted into an LCD or an organic light-emitting display device in the form of a film or sheet.

A backlight (or transmissive) LCD includes a liquid crystal cell and a backlight unit placed behind the liquid crystal cell and providing light to the liquid crystal cell. The liquid crystal cell includes a pair of substrates (a TFT substrate and a substrate facing the TFT substrate) and a liquid crystal layer interposed between the substrates. The backlight unit includes a light source, and a light guide plate (LGP) and a reflective plate which guide light emitted from the light source to the liquid crystal cell. A light-scattering substrate according to exemplary embodiments of the present invention can be placed at any position. For example, the light-scattering substrate may be disposed between the LGP and the liquid crystal cell, on a surface of the LGP, on a rear surface of the liquid crystal cell, or on a surface of the liquid crystal cell.

A reflective LCD includes a liquid crystal cell and a reflector which is placed behind the liquid crystal cell and reflects incident light. A light-scattering substrate according to exemplary embodiments of the present invention can be placed at any position as long as it is located in front of the reflector. In a TFT LCD, a light-scattering substrate according to exemplary embodiments of the present invention may be positioned between a substrate facing a TFT substrate and a polarizing film. However, the light-scattering substrate can be placed at any position.

An organic light-emitting display device comprises a display panel which includes a cathode formed on a surface of a substrate, an organic electroluminescent layer, and an anode. A light-scattering substrate according to exemplary embodiments of the present invention may be disposed on a surface of the substrate, but can be placed at any position.

Hereinafter, a method of manufacturing an organic light-emitting display device according to an exemplary embodiment of the present invention will be described with reference to FIGS. 12 thru 23.

FIGS. 12 thru 23 are cross-sectional views respectively illustrating processes in a method of manufacturing an organic light-emitting display device according to an exemplary embodiment of the present invention.

Figure 12:
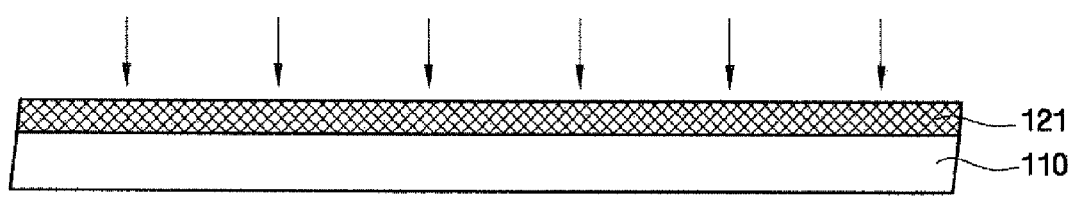
FIGS. 12 thru 23 are cross-sectional views respectively illustrating processes in a method of manufacturing an organic light-emitting display device according to an exemplary embodiment of the present invention.

Referring to FIG. 12, a metal thin film 121 is deposited on a substrate 110.

The substrate 110 may be made of a glass material having $SiO_2$ as its main component. However, the present invention is not limited thereto. That is, the substrate 110 may be made of various materials, such as a plastic material. However, since the organic light-emitting display device according to the current exemplary embodiment is a bottom emission type in which an image is formed in the direction of the substrate 110, the substrate 110 must be made of a transparent material.

The metal thin film 121 may be deposited on the substrate 110 using, e.g., sputtering or CVD. The metal thin film 121 may be made of a metal which can agglomerate on the substrate 110 during an annealing process due to its high surface energy, among metals showing the surface plasmon phenomenon. Specifically, the metal thin film 121 may be made of Ag, Au, a mixture of Ag and Au, or an alloy of Ag or Au and one or more of Cu, Ni, Co, Fe, Zn, Ti, Cr, Pt, Al and Pd. Here, the Ag or Au may be added at 80 wt % or more based on a total weight of the alloy. When added at 80 wt % or more, the Ag or Au can agglomerate into metal nanoparticles and exhibits a superior light-scattering effect.

Figure 13:

Referring to FIGS. 12 and 13, a light-scattering layer 120 is formed by annealing the metal thin film 121. The annealing process may be performed using a thermal annealing method using a furnace, a laser annealing method, or an RTA method. In addition, the annealing process may be performed at a temperature of 200 to 350° C. for one hour in the atmosphere of an inert gas such as air or nitrogen. The conditions under which the annealing process is performed can be arbitrarily changed by those of ordinary skill in the art. If possible, however, the annealing process may be performed at a temperature of 200 to 350° C. When the metal thin film 121 is annealed, the metal which forms the metal thin film 121 agglomerates into a plurality of metal nanoparticles attached onto the substrate 110. In addition, as the metal agglomerates into the metal nanoparticles, the substrate 110 is partially exposed. The method of forming the light-scattering layer 120 is the same as the above-described method of manufacturing a light-scattering substrate, and thus a detailed description thereof is omitted.

Figure 14:
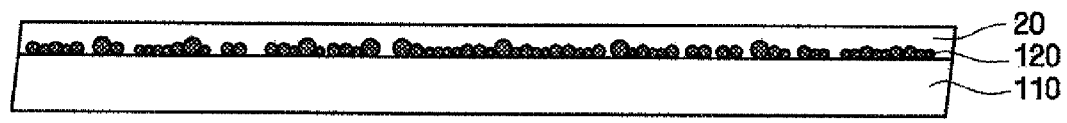

Referring to FIG. 14, a buffer layer 20 is formed on the substrate 110 so as to form a smooth surface on the substrate 110 and prevent the infiltration of impurity elements into the substrate 110. To form the buffer layer 20, $SiO_2$ and/or $SiN_x$ may be deposited using various methods such as PECVD, atmospheric pressure CVD (APCVD), and low pressure CVD (LPCVD). Since the buffer layer 20 is formed on the substrate 110 so as to be thicker than the light-scattering layer 120, the metal nanoparticles of the light-scattering layer 120 are contained in the buffer layer 20.

Figure 15:
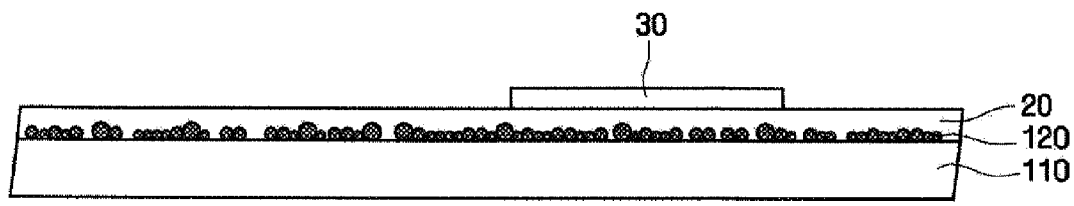

Referring to FIG. 15, an active layer 30 is formed by stacking a semiconductor layer on the buffer layer 20 and patterning the semiconductor layer. The semiconductor layer may be made of amorphous silicon or polycrystalline silicon. The patterning process may be a photolithography process using a mask. The polycrystalline silicon may be deposited directly on the buffer layer 20. Alternatively, after the amorphous silicon is deposited, it may be crystallized using various methods, such as an RTA method, a solid phase crystallization (SPC) method, an excimer laser annealing (ELA) method, a metal induced crystallization (MIC) method, a metal induced lateral crystallization (MILC) method, and a sequential lateral solidification (SLS) method.

Figure 16:
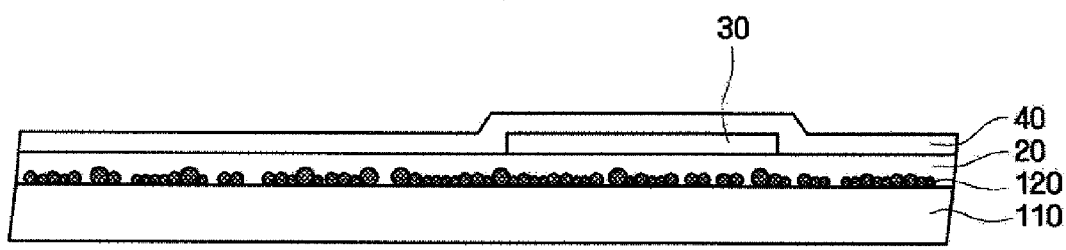

Referring to FIG. 16, a gate insulating film 40 is formed by depositing an insulating material on the buffer layer 20 and the active layer 30 using sputtering or CVD. The gate insulating film 40 may be made of an inorganic material, an organic material, or a mixture of the inorganic material and the organic material. Examples of the inorganic material may include $SiO_2$, $SiN_x$, and SiON.

Figure 17:
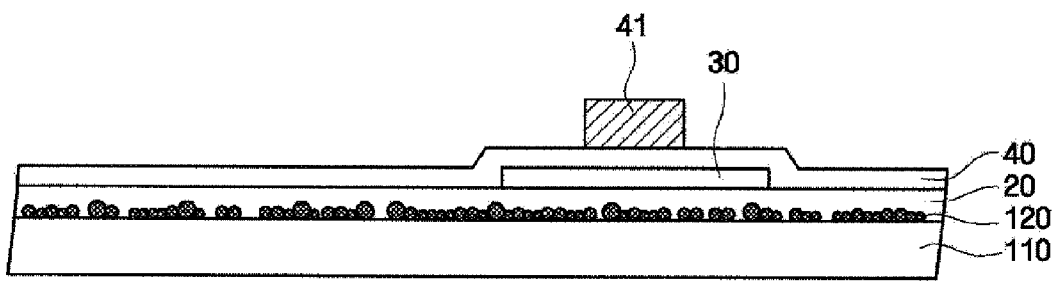

Referring to FIG. 17, a conductive film for forming a gate electrode is formed on the gate insulating film 40 using, e.g., sputtering and is then patterned, thereby forming a gate electrode 41 which overlaps a channel region 32 of the active layer 30.

The conductive film may be formed of a single layer of a material or a mixture of materials selected from the group consisting of Mo, W, AlNd, Ti, Al, Ag, and an alloy of these materials. Alternatively, the conductive film may be formed of a double- or multi-layer of Mo, Al or Ag, which is a material with low resistivity, in order to reduce wiring resistance.

Figure 18:
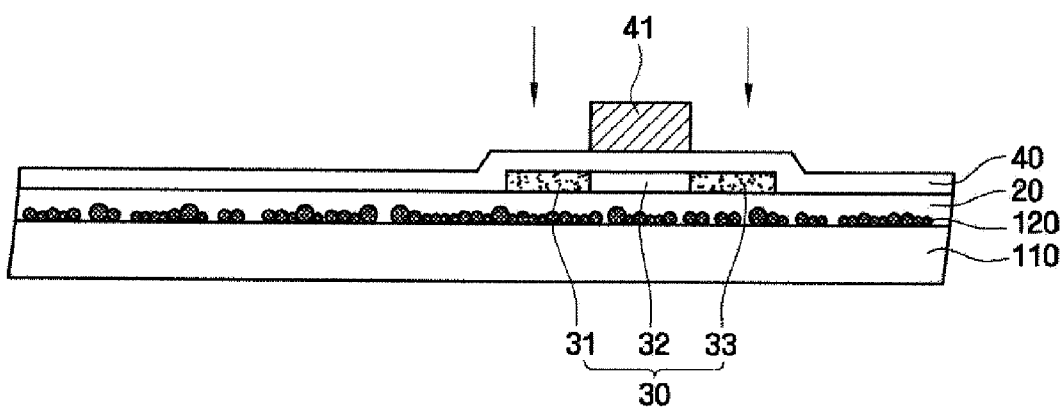

Referring to FIG. 18, the active layer 30, including the channel region 32 and source and drain regions 31 and 33, respectively, is formed by implanting N- or P-type impurities using the gate electrode 41 as a mask. The channel region 32 serves as a passage for electrons and is unimplanted with impurities. The source and drain regions 31 and 33, respectively, are formed by implanting impurities into both sides of the channel region 32. For example, donor impurity ions, such as P, As or Sb, may be injected so as to manufacture an N-type TFT. On the other hand, acceptor impurity ions, such as B, Al, Ga or In, may be injected so as to manufacture a P-type TFT.

Figure 19:
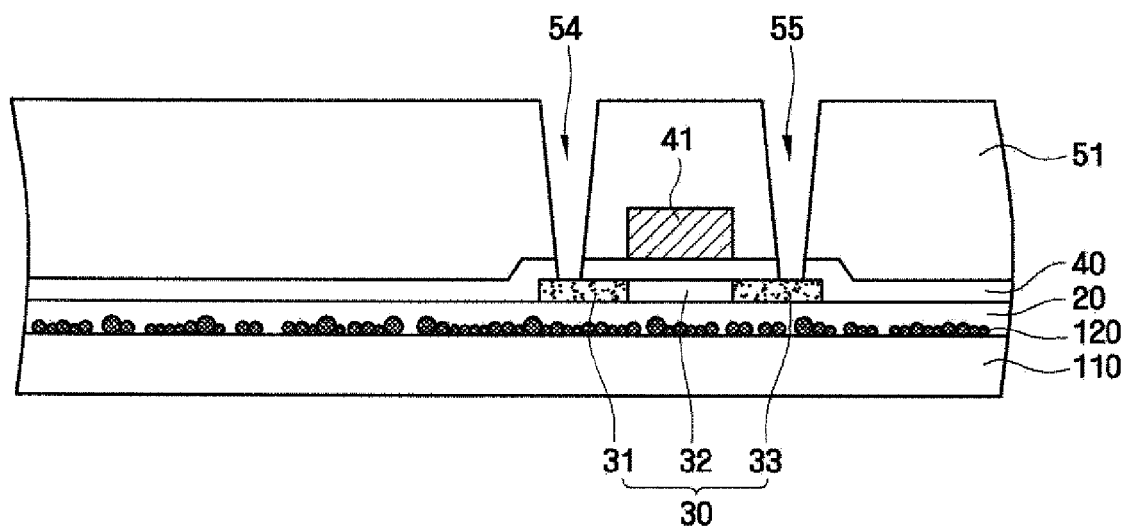

Referring to FIG. 19, an interlayer insulating film 51 is formed on the gate insulating film 40 so as to be higher than the gate electrode 41 relative to the substrate 110. The interlayer insulating film 51 may be formed by sputtering or CVD and may be formed of two or more layers as desired by those of ordinary skill in the art. Each layer in this multi-layer structure may be formed to various thicknesses as desired by those of ordinary skill in the art. In addition, a topmost interlayer insulating film in the multi-layer structure may be formed to have a planar top surface. The interlayer insulating film 51 may be formed of an inorganic insulating film, an organic insulating film, or a composite of the inorganic insulating film and the organic insulating film.

Contact holes 54 and 55, exposing the source and drain regions 31 and 33, respectively, of the active layer 30 may be formed in the interlayer insulating film 51 by a photolithography process. Here, the interlayer insulating film 51 may be dry-etched or wet-etched.

Figure 20:
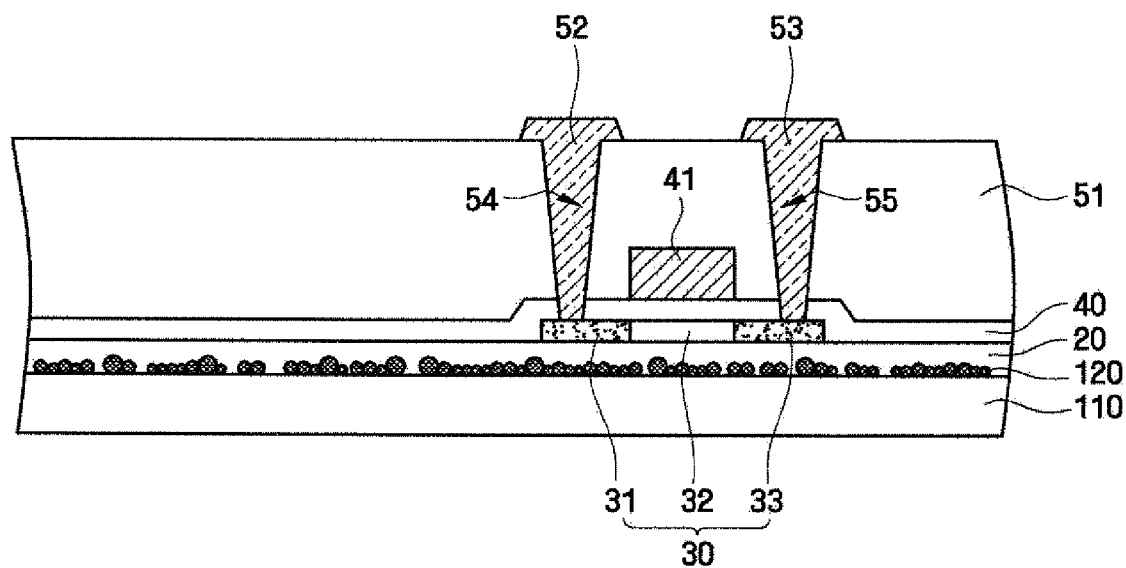

Referring to FIG. 20, a conductive film for forming source and drain electrodes is formed on the interlayer insulating film 51 so as to fill the contact holes 54 and 55, respectively, and is then patterned, thereby forming source and drain electrodes 52 and 53, respectively.

Figure 21:
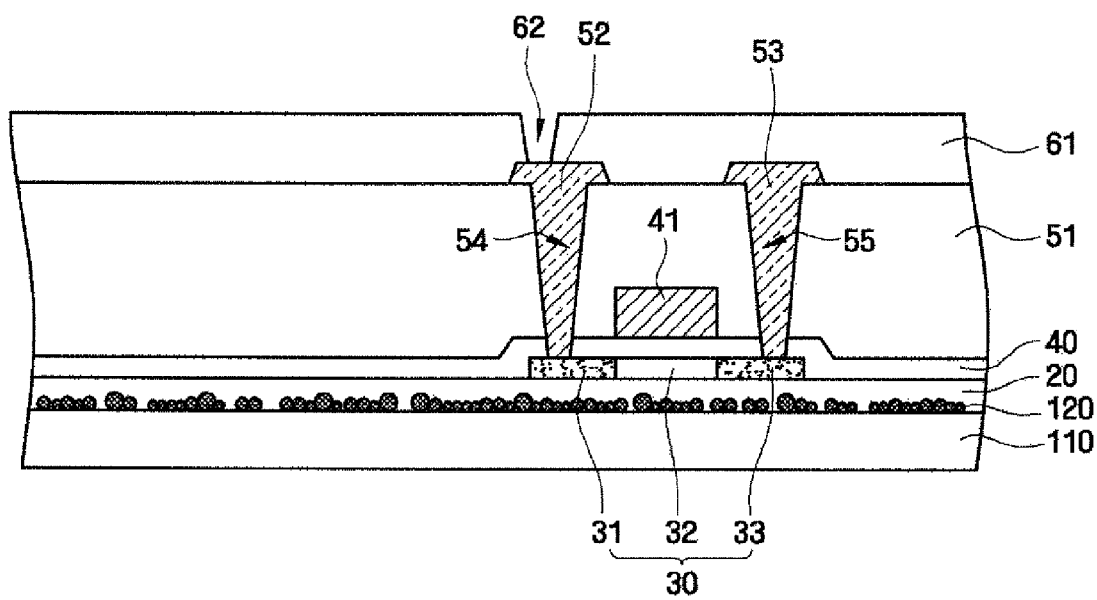

Referring to FIG. 21, a passivation layer 61 is formed on the interlayer insulating film 51 so as to cover the source and drain electrodes 52 and 53, respectively. Specifically, the passivation layer 61 is formed by depositing an organic material or an inorganic material on the interlayer insulating film 51 using sputtering or CVD. In addition, a contact hole 62 exposing a region of any one of the source and drain electrodes 52 and 53, respectively, is formed in the passivation layer 61. The contact hole 62 may be formed by a photolithography process using a mask. Here, a wet-etching or dry-etching process may be performed.

Figure 22:
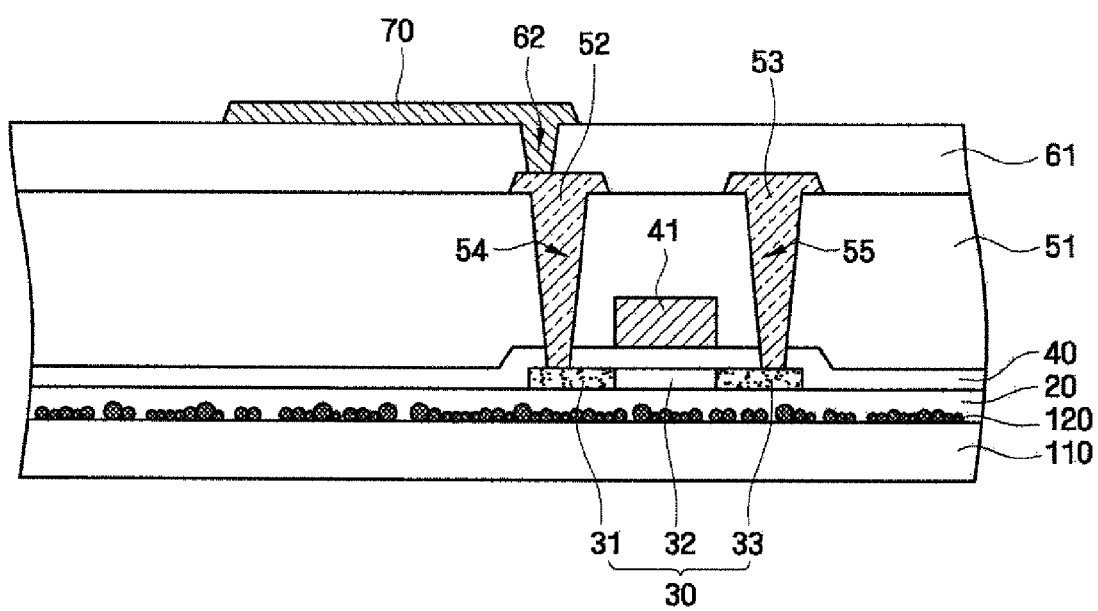

Referring to FIG. 22, a conductive film for forming a first electrode is deposited on the passivation layer 61 using sputtering or CVD so as to fill the contact hole 62. Then, the conductive film is patterned by a photolithography process, thereby forming a first electrode 70. Since the organic light-emitting display device according to the current exemplary embodiment is a bottom emission type, the first electrode 70 is formed to be a transparent electrode.

Figure 23:
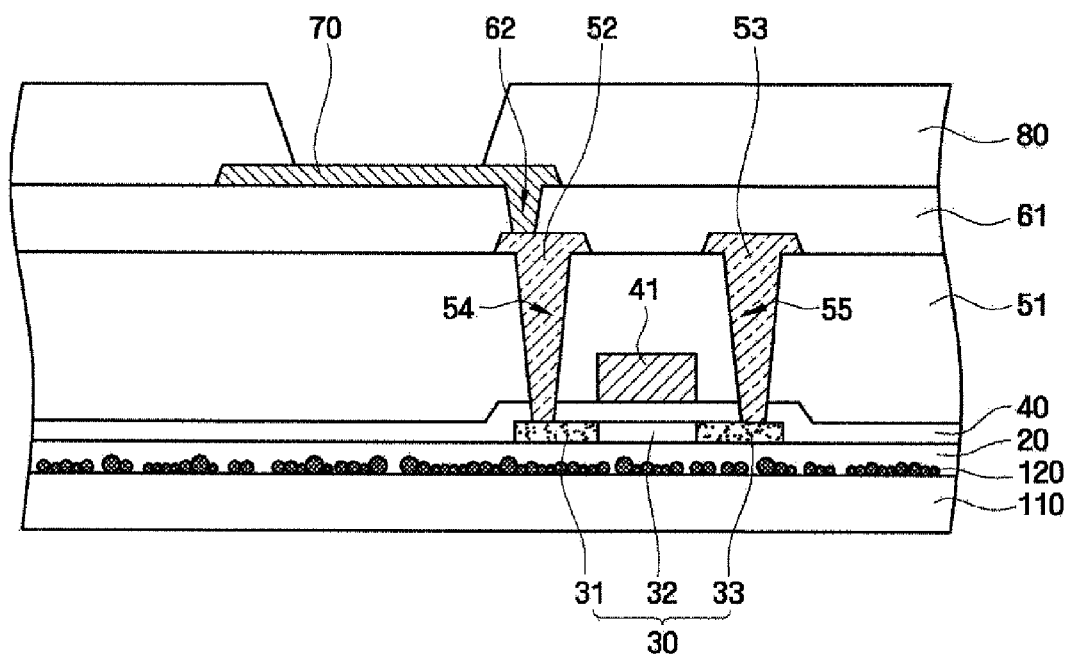

Referring to FIG. 23, a material for forming a pixel defined layer is deposited on the passivation layer 61 and the first electrode 70 using, e.g., CVD. Then, the material is patterned to expose a region of the first electrode 70. As a result, a pixel defined layer 80 is formed. The pixel defined layer 80 not only defines a light-emitting region but also widens the gap between an edge of the first electrode 70 and a second electrode 72. The widened gap prevents an electric field from being concentrated on the edge of the first electrode 70, thereby averting a short circuit between the first electrode 70 and the second electrode 72.

A metal thin film is deposited on the region of the first electrode 70 which is exposed by the pixel defined layer 80. Then, the metal thin film is annealed to form a plurality of nanoparticles attached to a top surface of the first electrode 70. Accordingly, a light-scattering layer composed of the metal nanoparticles is formed on the first electrode 70. The light-scattering layer may be formed in the same way as the above-described light-scattering layer 120. In addition, a transparent conductive layer may be formed on the light-scattering layer on the first electrode 70 so as to contain the metal nanoparticles of the light-scattering layer.

As described above, in the method of manufacturing an organic light-emitting display device according to the present invention, a light-scattering layer is formed directly on a substrate. Therefore, an organic light-emitting display device having a superior light-scattering effect can be manufactured.

Hereinafter, effects of a light-scattering substrate according to an exemplary embodiment of the present invention will be described in greater detail by way of example. The following example is intended as a detailed description of the present invention, but does not limit the scope of the present invention.

Example

Haze Measurement

An alloy of Ag, Pd, and Cu was deposited to a predetermined thickness on a glass substrate and annealed at 250° C. for one hour in the presence of $N_2$ to form metal nanoparticles. Then, haze with respect to the thickness of a thin film of the Ag—Pd—Cu alloy was measured, and the measurement results are shown in FIG. 24.

Figure 24:
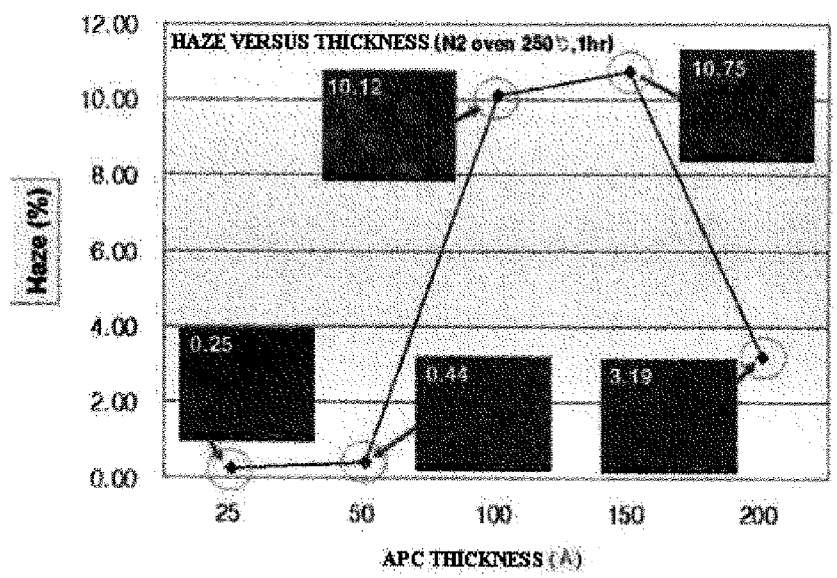
FIG. 24 is a graph illustrating haze with respect to the thickness of a light-scattering layer of a light-scattering substrate according to an exemplary embodiment of the present invention.

FIG. 24 is a graph illustrating haze with respect to the thickness of a light-scattering layer of a light-scattering substrate according to an exemplary embodiment of the present invention.

As shown in FIG. 24, a metal thin film formed to a thickness of 100 to 200 Å shows a high haze value, and larger metal nanoparticles result in higher haze values. In the case of a metal thin film formed to a thickness of approximately 150 Å, for example, an average diameter of metal nanoparticles is approximately 400 nm.

In a method of manufacturing a light-scattering substrate according to an exemplary embodiment of the present invention, metal nanoparticles can be formed directly on a substrate so that they are attached to at least a surface of the substrate.

In a light-scattering substrate according to an exemplary embodiment of the present invention, metal nanoparticles attached onto a substrate bring about a light-scattering effect. Therefore, there is no need to insert light-scattering particles into a film or sheet.

A light-scattering substrate according to an exemplary embodiment of the present invention can be thinned since it does not require a film or sheet for accommodating light-scattering particles.

A light-scattering substrate according to an exemplary embodiment of the present invention exhibits superior thermal resistance, and its properties do not change even when the light-scattering substrate is exposed to high heat in a subsequent process for manufacturing a display device which includes the light-scattering substrate.

A light-scattering substrate according to an exemplary embodiment of the present invention can be used in place of a substrate in LCDs or organic light-emitting display devices. When a light-scattering substrate according to an exemplary embodiment is used as a substrate of a display device, there is no need to install a light-scattering sheet or film.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only, and not for purposes of limitation.

What is claimed is:

1. A method of manufacturing an organic light-emitting display device, the method comprising the steps of:
    forming a plurality of metal particles attached to a transparent substrate by stacking a metal thin film on the substrate and annealing the metal thin film so as to agglomerate a metal of the metal thin film;
    forming a buffer layer on the substrate so as to contain the metal particles;
    forming an active layer, which includes a source region and a drain region, on the buffer layer;
    forming a gate insulating film on the substrate and the active layer;

forming a gate electrode on the gate insulating film to overlap a channel region of the active layer;

forming an interlayer insulating film on the gate insulating film to cover the gate electrode;

forming a source electrode and a drain electrode, which are connected to the source region and the drain region, respectively, on the interlayer insulating film;

forming a passivation layer on the interlayer insulating film and on the source electrode and the drain electrode;

forming a transparent first electrode, which is connected to one of the source electrodes and the drain electrodes, on the passivation layer;

forming a pixel defined layer, which exposes a predetermined region of the first electrode, on the passivation layer and the first electrode; and forming a plurality of metal nanoparticles attached to the first electrode by stacking a metal thin film on the predetermined region of the first electrode, the predetermined region of the first electrode being exposed by the pixel defined layer, and by annealing the metal thin film.

2. The method of claim 1, wherein the metal thin film is formed to a thickness in a range of 100 to 200 Å.

3. The method of claim 1, wherein the metal thin film is formed by depositing an alloy of Ag, Pd, and Cu.

4. The method of claim 1, wherein the annealing of the metal thin film is performed at a temperature in a range of 200 to 350° C.

5. The method of claim 1, further comprising the step of forming a transparent conductive layer by depositing a transparent conductive material on the substrate and the light-scattering layer after the forming of the light-scattering layer.

6. The method of claim 5, wherein the transparent conductive material is one of ITO and IZO.

7. A method of manufacturing an organic light emitting display device, the method comprising the steps of:

forming a plurality of metal particles attached to a transparent substrate by stacking a metal thin film on the substrate and annealing the metal thin film to agglomerate a metal of the metal thin film;

forming a transparent conductive layer on the substrate to contain the metal particles;

forming a buffer layer on the transparent conductive layer;

forming an active layer, which includes a source region and a drain region, on the buffer layer;

forming a gate insulating film on the substrate and the active layer;

forming a gate electrode on the gate insulating film to overlap a channel region of the active layer;

forming an interlayer insulating film on the gate insulating film to cover the gate electrode;

forming a source electrode and a drain electrode, which are connected to the source region and the drain region, respectively, on the interlayer insulating film;

forming a passivation layer on the interlayer insulating film and on the source electrode and the drain electrode;

forming a transparent first electrode, which is connected to one of the source electrodes and the drain electrodes, on the passivation layer;

forming a pixel defined layer, which exposes a predetermined region of the first electrode, on the passivation layer and the first electrode; and forming a plurality of metal nanoparticles attached to the first electrode by stacking a metal thin film on the predetermined region of the first electrode, the predetermined region of the first electrode being exposed by the pixel defined layer, and by annealing the metal thin film.

8. The method of claim 7, wherein the metal thin film is formed to a thickness in a range of 100 to 200 Å.

9. The method of claim 7, wherein the metal thin film is formed by depositing an alloy of Ag, Pd, and Cu.

10. The method of claim 7, wherein the annealing of the metal thin film is performed at a temperature in a range of 200 to 350° C.

11. The method of claim 7, wherein the transparent conductive material is one of ITO and IZO.

* * * * *